US008310297B2

(12) United States Patent
Shimogawa et al.

(10) Patent No.: US 8,310,297 B2
(45) Date of Patent: Nov. 13, 2012

(54) SEMICONDUCTOR DEVICE

(75) Inventors: Kenjyu Shimogawa, Kanagawa (JP); Hiroshi Furuta, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 110 days.

(21) Appl. No.: 12/929,753

(22) Filed: Feb. 14, 2011

(65) Prior Publication Data
US 2011/0199140 A1    Aug. 18, 2011

(30) Foreign Application Priority Data

Feb. 18, 2010  (JP) .................................. 2010-033710

(51) Int. Cl.
*H03K 3/01*       (2006.01)
(52) U.S. Cl. ........................................ 327/530; 327/534
(58) Field of Classification Search .................. 327/530, 327/534, 535, 537
See application file for complete search history.

(56) References Cited

U.S. PATENT DOCUMENTS
7,161,408 B2 *  1/2007  Mizuno et al. ................ 327/534
2003/0198110 A1  10/2003  Hasegawa et al.

FOREIGN PATENT DOCUMENTS
JP      2003-317479     11/2003
JP      2006-252696      9/2006
* cited by examiner

*Primary Examiner* — An Luu
(74) *Attorney, Agent, or Firm* — McGinn IP Law Group, PLLC

(57) ABSTRACT

Disclosed is a semiconductor device including a mode control circuit that, when a standby control signal is in an activated state, based on a timer output signal from a timer circuit, generates a MODE control output signal that changes a logic state of a functional circuit part at every prescribed time interval, and an output control circuit that receives an output signal of the functional circuit part and controls output of the output signal; based on a delay output signal generated by delaying a MODE control output signal by a delay circuit. While the functional circuit part is changing the logic state by the MODE control output signal, the output control circuit does not transfer the functional circuit part output signal to output, but holds and outputs a functional circuit part output signal immediately before the functional circuit part changes the logic state by the MODE control output signal.

10 Claims, 16 Drawing Sheets

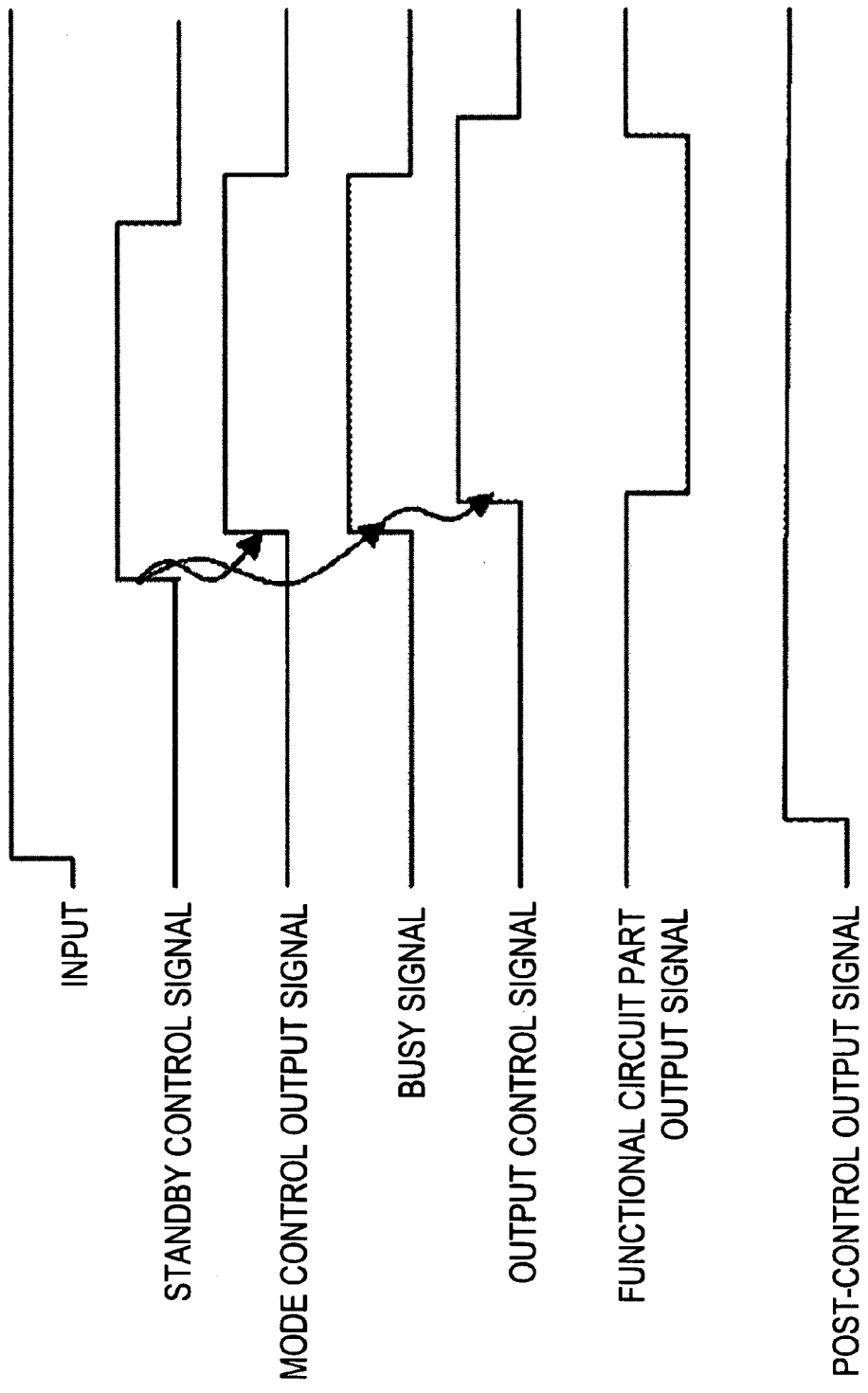

SEMICONDUCTOR DEVICE

TECHNICAL FIELD

Reference to Related Application

This application is based upon and claims the benefit of the priority of Japanese patent application No. 2010-033710, filed on Feb. 18, 2010, the disclosure of which is incorporated herein in its entirety by reference thereto. The present invention relates to a semiconductor device, and in particular, to a semiconductor integrated circuit device including a transistor which can withstand deterioration due to bias temperature instability.

Background

As stress relaxation in a MISFET (Metal Insulator Semiconductor Field effect Transistor) of a semiconductor circuit which is in an operation state, the stress relaxation by a Hot Carrier Injection (HCI) or Time Dependent Dielectric Breakdown (TDDB) is known.

There has been significant reduction in transistor dimensions ascribable to progress in miniaturization technology for semiconductor processes in recent times. As the deterioration in characteristics due to stress in miniaturized semiconductor devices, the phenomenon of device deterioration due to gate bias and temperature, referred to as NBTI (Negative Bias Temperature Instability) has become a problem. NBTI is accelerated by a high temperature, and occurs when a bias state of a MISFET (P-type MISFET) is in a specific state. In case of an N-type MISFET, PBTI (Positive Bias Temperature Instability) is a problem.

Regarding NBTI, Patent Document 1, for example, discloses a method and device in which it is ensured that a specific memory element is in a first state during a first part of a time-period in which an electronic system operates, and data during this time is stored in a first phase and a specific memory element is in a second state during a second part of a time-period in which the electronic system operates, and data during this time is stored in a second phase, and a threshold voltage shift due to bias temperature instability is reduced. In this way, by changing the state of the specific memory element, a bias state of an FET (Field Effect Transistor) is changed, and BTI deterioration is suppressed. Patent Document 2 discloses an invention in which a MOSFET forming a precharge circuit provided in a signal line on which is transmitted to a main amplifier a signal read from a memory cell selected by a selection circuit from among a memory array having a plurality of memory cells. The MOSFET is turned ON based on a selection start signal for a memory cell which is transferred to the selection circuit. The MOSFET is turned OFF and precharging is ended before the read signal is transmitted from the memory cell and NBTI deterioration is avoided during a standby time. In this invention, with regard to a bias state of a transistor of a specified circuit, an operation timing of the transistor is adjusted so as to reduce time during which NBTI stress is applied.

[Patent Document 1]
JP Patent Kokai Publication No. JP2006-252696A
[Patent Document 2]
JP Patent Kokai Publication No. JP2003-317479A

SUMMARY

The entire disclosures of Patent Documents 1 and 2 are incorporated herein by reference thereto. An analysis of the related technology is given below.

In the related technology disclosed in Patent Documents 1 and 2, NBTI stress is relaxed by changing a bias condition of a specific transistor or memory element. In Patent Document 1, a bias condition of a specific transistor is changed in a time range in which the specific transistor has no effect on the other circuit. In the technology disclosed in Patent Document 2, which changes a logic state of a memory cell, as long as "reading" of a memory cell is not performed, the memory cell has no effect on the other circuit.

Among functional circuits, while there is a circuit, which is always in operation, such as an oscillator circuit that generates an internal clock signal, there is another circuit that does not operate in a specific predetermined time. The functional circuit, in case of a logic circuit, refers to a circuit block having a specific function, such as, for example, an arithmetic circuit, an encoding circuit/decoding circuit, a signal processing circuit, and the like. The functional circuit clearly can include an analog circuit such as, for example, an analog PLL (Phase Locked Loop).

With regard to functional circuits, it is difficult to change a bias state of a circuit that is in continuous operation. Furthermore, even with a circuit that is not in continuous operation, when a bias state is changed, a logic state of the circuit is changed and an operation of a circuit (succeeding stage circuit) that receives output of the circuit in question. As a result, for a circuit that is not in continuous operation in the functional circuit, even in a time period during which the circuit in question is not in operation, changing the bias state and changing an operation state of the entire circuit have not been performed heretofore.

According to the present invention, there is provided a semiconductor integrated circuit device comprising:

a functional circuit part that includes a plurality of field effect transistors to perform a predetermined function;

a timer circuit that generates a timer output signal at every prescribed time interval;

a mode control circuit that receives a first control signal and that when said first control signal is in an active state, generates a second control signal that is used to change a logic state of said functional circuit part, at every prescribed time interval, responsive to said timer output signal outputted from said timer circuit;

an output control circuit that receives an output signal of said functional circuit part and controls output of said output signal; and a control signal generation circuit that generates a third control signal responsive to said second control signal and supplies said third control signal to said output control circuit, wherein during a time period when said functional circuit part changes a logic state responsive to said second control signal, said output control circuit, responsive to said third control signal, performs control so as not to transfer an output signal of said functional circuit part to an output of said output control circuit, but to hold and output an output signal of said functional circuit part immediately before said functional circuit part changes a logic state thereof responsive to said second control signal.

According to the present invention, a functional circuit in a standby state is enabled to change its logic state without affecting another functional circuit, and to relax stress in a field effect transistor forming the functional circuit. Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 16 is a timing chart describing operation of the third exemplary embodiment of the present invention.

PREFERRED MODES

Preferred modes of the present invention will be described in the below. In a semiconductor integrated circuit device according to the embodiments, there are provided a functional circuit part (30) that includes a plurality of field effect transistors to perform a predetermined function, a timer circuit (10) that generates a timer output signal at every prescribed time interval, a mode control circuit (20) that receives a first control signal (standby control signal) and that when the first control signal is in an active state, generates a second control signal (MODE control output signal) that is used to change a logic state of the functional circuit part (30), at every prescribed time interval, responsive to the timer output signal outputted from the timer circuit, an output control circuit (50) that receives an output signal of the functional circuit part and controls output of the output signal, and a control signal generation circuit ( ) delay circuit) that generates a third control signal (delay output signal) responsive to the second control signal and supplies the third control signal to the output control circuit (50). During a time period when the functional circuit part (30) changes a logic state responsive to the second control signal (MODE control output signal), the output control circuit (50), responsive to the third control signal (delay output signal) that is made active, performs control so as not to transfer an output signal of the functional circuit part (30) as an output signal (post-control output signal) from the output control circuit (50), but instead to hold and output an output signal (functional circuit part output signal) of the functional circuit part (30) immediately before the functional circuit part (30) changes its logic state responsive to the second control signal (MODE control output signal). Principles of operation of the present invention will be described.

As described later, in many circuits, two bias conditions exist:
a bias condition forming stress with which NBTI deterioration progresses, and
a bias condition forming stress with which NBTI deterioration does not progress.
With regard to a circuit (functional circuit), there has heretofore been no proposal of a method of relaxing a stress by alternately changing these two bias states, as in
a circuit changes from a state in which the circuit does not perform normal operation to a standby state, and
an entire circuit is in a state in which the entire circuit does not perform normal operation, but a bias condition thereof changes (a change to a condition in which the entire circuit performs normal operation).
In order to make the present invention understood better, a relationship between a bias state of a general logic circuit and NBTI stress and PBTI stress will be described. A description will be also given concerning a property of NBTI.

Figure 1:
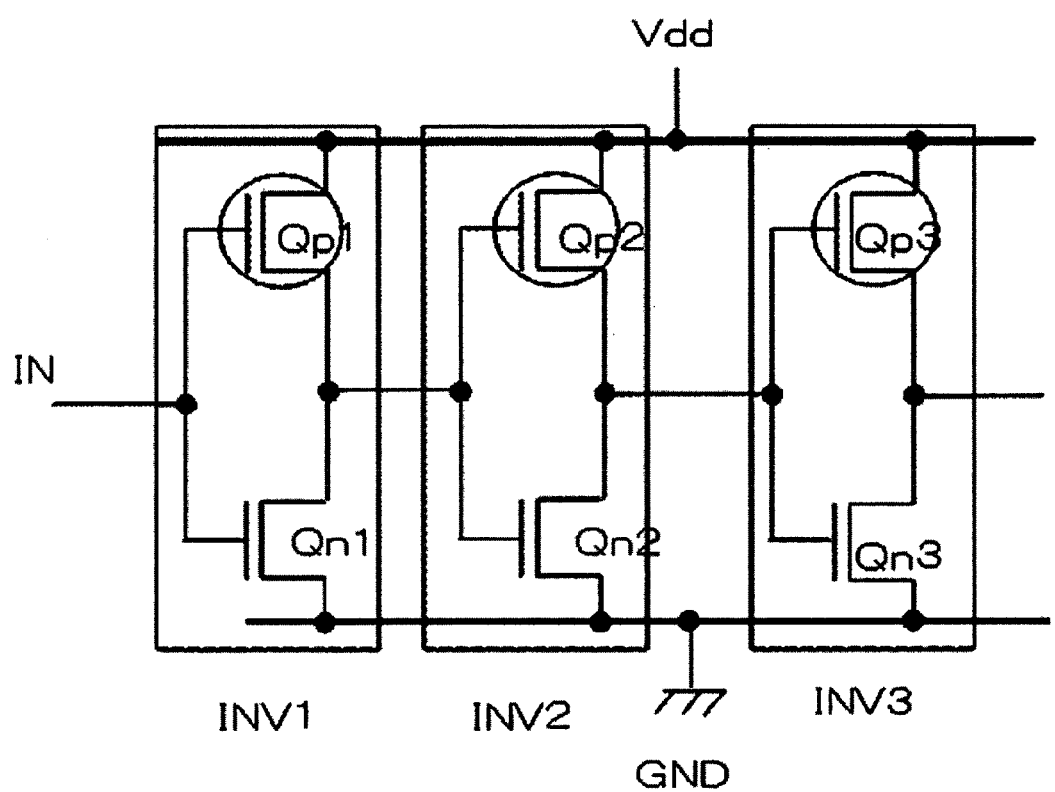
FIG. 1 is a diagram for describing the present invention.

FIG. 1 shows a circuit configuration of three-stage inverters arranged in cascade connection, each of inverters being formed of complementary MISFETs (composed by P-type MISFETs and N-type MISFETs). More specifically, each inverter INVi (where i=1, 2, 3) includes a P-type MISFET (Qpi) having a source connected to a power supply Vdd, and an N-type MISFET (Qni) having a source connected to GND and having a gate and a drain connected respectively to a gate and a drain of the P-type MISFET (Qpi). In FIG. 1, an input IN of the first stage inverter INV1 is set to Low and the circuit is in a standby state. In the standby state, the P-type MISFETs Qp1 and Qp3 in the inverters INV1 and INV3 are in an ON state, the sources and drains of both P-type MISFETs Qp1 and Qp3 are at a power supply voltage Vdd (High), and the gates both P-type MISFETs Qp1 and Qp3 are biased to GND. At this time, the respective bias states of the P-type MISFETs Qp1 and Qp3 correspond to a bias state forming stress where NBTI deterioration progresses.

On the other hand, the P-type MISFET Qp2 of the inverter INV2 is in an OFF state, the source and drain of the P-type MISFET Qp2 are set to the power supply voltage Vdd and GND potential, respectively, and the gate of the P-type MISFET Qp2 is biased to the power supply voltage Vdd. The bias state of the P-type MISFET Qp2 is not a bias state forming stress where NBTI deterioration progresses. The N-type MISFET Qn2 is in an ON state, the source and drain of the N-type MISFET Qn2 are set to GND potential, and the gate of the N-type MISFET Qn2 is set to the power supply voltage Vdd. The bias state of the N-type MISFET Qn2 is a bias state forming stress where PBTI deterioration progresses.

If these bias states continue in the respective MISFETs, there are one or more MISFETs where deterioration progresses and one or more MISFETs where deterioration does not progress. This has an effect on a circuit characteristic.

The NBTI (focusing on the P-type MISFETs) has the following type of characteristics.

In general, the higher the temperature, the more the deterioration progresses (acceleration occurs at a high temperature).

The larger an electric field of the gate, the more the deterioration progresses.

There is a recovery effect, and when the NBTI stress condition is released, there is a tendency for recovery from the deterioration to take place. It is to be noted that the present embodiments also gives consideration to this recovery effect.

In the preferred modes of the present invention, the stress is relaxed by changing a condition, such as changing a state of a circuit (functional circuit) from a state where the circuit does not perform normal operation to a standby state; and changing a bias condition in a state where an entire circuit (functional circuit) does not perform normal operation.

In the preferred modes of the present invention, a unit whose a bias condition is changed is not a specified transistor, nor a specified small sized circuit (such as a memory cell). A bias condition is changed collectively with a functional circuit as a unit.

In the preferred modes of the present invention, with regard to the functional circuit that is a subject of a bias condition change, by a change of a bias condition of transistors in the functional circuit in question, control is performed so that another functional circuit is not affected, and stress in the transistor in the functional circuit in question is relaxed. A description will be given below according to several exemplary embodiments.

First Exemplary Embodiment

Figure 2:
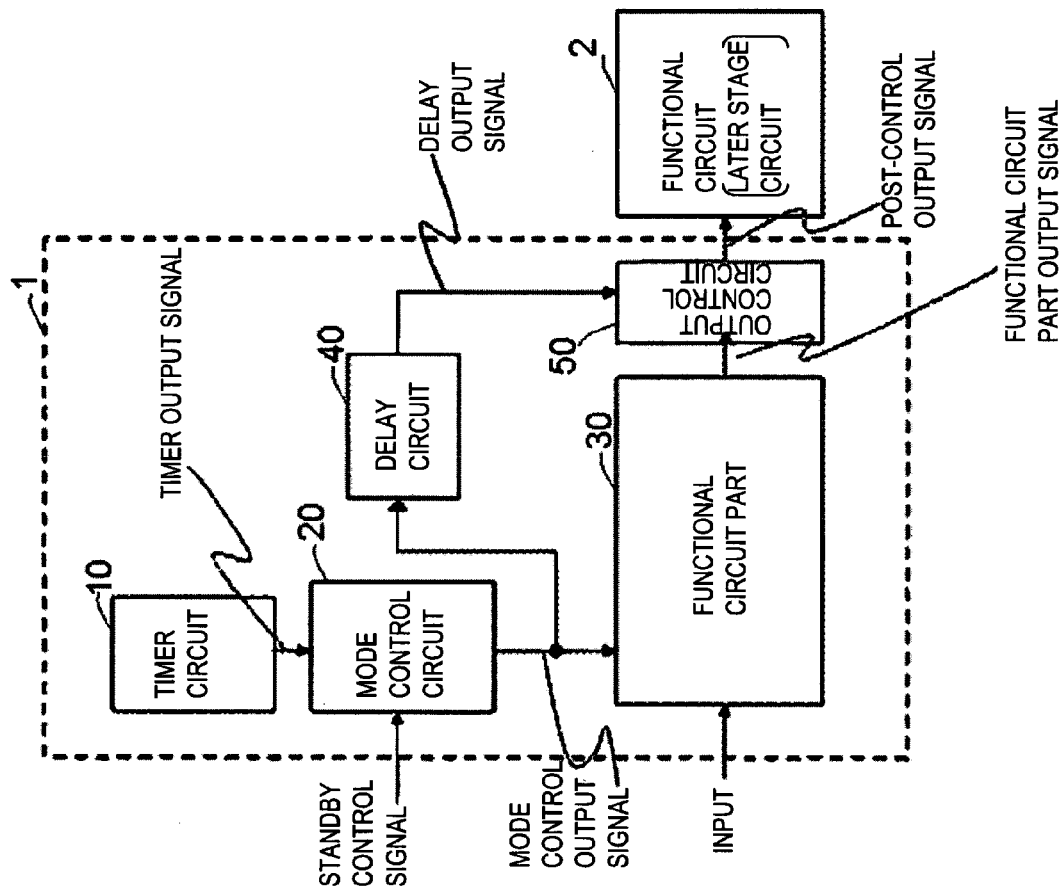
FIG. 2 is a diagram showing a configuration of a first exemplary embodiment of the invention.

FIG. 2 is a diagram showing a configuration of main parts of a semiconductor integrated circuit device according to first exemplary embodiment of the present invention. Functional circuits 1 and 2 are included in the semiconductor integrated circuit device. It is to be noted that in FIG. 2, the functional circuit 1 that is a subject of a bias condition change and the functional circuit 2 of a later stage thereof are shown only for simplification of the description. In the present invention, the number of functional circuits is not limited to two. The semiconductor integrated circuit device may, as a matter of course, include any circuit block other than functional circuit 1 and 2.

Referring to FIG. 2, the functional circuit 1 includes a timer circuit 10 that outputs a timer output signal (for example, a High pulse), at every predetermined prescribed time interval, a MODE control circuit 20 that receives the timer output signal outputted from the timer circuit 10 and a standby control signal supplied thereto, and outputs a MODE control output signal, a functional circuit part 30 that includes a circuit that controls whether or not an input to functional circuit part 30 is inverted by the MODE control output signal which is an output of the MODE control circuit 20, a delay circuit 40 that receives the MODE control output signal from the MODE control circuit 20 and outputs a signal (delay output signal) obtained by delaying the MODE control output signal, and an output control circuit 50 that controls output of a functional circuit part output signal, which is output from the functional circuit part 30, based on the delay output signal from the delay circuit 40, and outputs a post-control output signal to another functional circuit (later stage circuit).

Although not limited thereto, a configuration may be such that a standby control signal is supplied externally to the semiconductor integrated circuit device. Or, the configuration may be such that the standby control signal is activated (for example, set to a High level) when judged to be in a standby state by a decoder circuit (provided in the semiconductor integrated circuit device), not shown in the drawing, which decodes a control signal received from outside the semiconductor integrated circuit device. It is to be noted that the timer circuit 10 may include, for example, a timer counter which, counts a clock signal received, outputs a pulse signal of a prescribed pulse width, at a time point when a count value thereof reaches a pre-set count value, and then auto-clears the count value to restart the count up of the clock signal.

Figure 3:
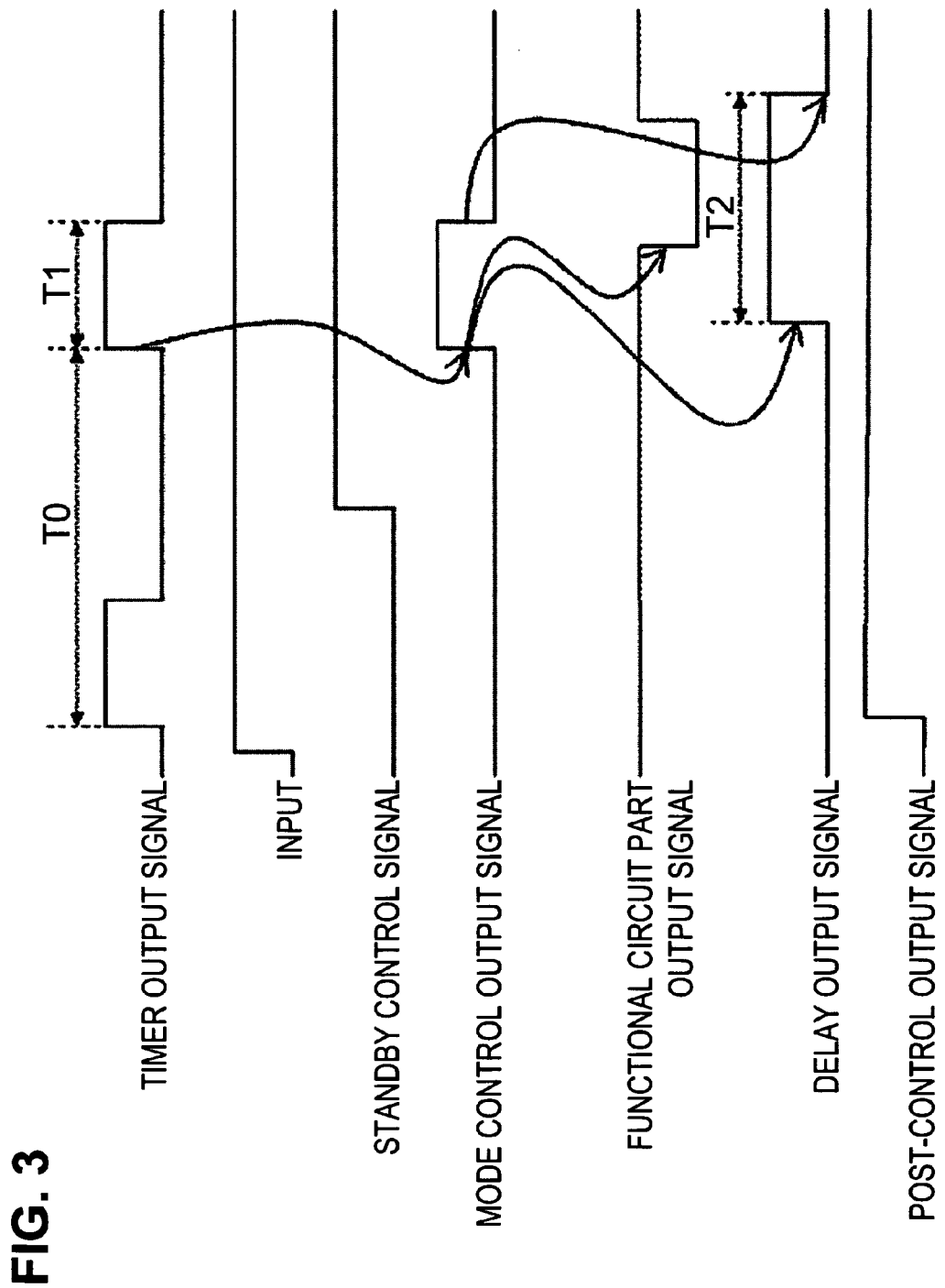
FIG. 3 is a timing chart describing operation of the first exemplary embodiment of the present invention.

FIG. 3 is a timing chart describing the operation of the circuit shown in FIG. 2. The functional circuit part 30 is assumed to invert the logic state thereof each time period T0. A High pulse of pulse width T1 is outputted from the timer circuit 10, at every time interval T0. At this time, when a standby control signal that puts the functional circuit in a standby state is High (indicating a standby state), the MODE control output signal from the MODE control circuit 20 also goes to High. The MODE control output signal rises at the same time as the timer output signal, and falls at the same time as the timer output signal with a pulse width T1.

An input signal is received by the functional circuit part 30. The input signal to the functional circuit part 30 may be supplied externally or internally generated by an internal circuit (not shown) of the semiconductor integrated circuit device. The MODE control output signal is supplied to the functional circuit part 30. When the MODE control output signal is High, the functional circuit part 30 inverts the input signal. As a result, a logic state of a circuit (including P-type MISFET and N-type MISFET) in the functional circuit part 30, whose logic state is determined by the input signal, is inverted.

The MODE control output signal output from the MODE control circuit 20 is supplied to the delay circuit 40. The delay circuit 40 delays the MODE control output signal by a prescribed time and supplies the delayed signal to the output control circuit 50 as a delay output signal (pulse width T2). More specifically, the delay circuit 40 delays a rise timing and a fall timing of a High pulse of the MODE control output signal High, and a delay output signal of a High pulse with a pulse width T2 (>T1) which rises after a delay from the rising edge of the MODE control output signal, is outputted.

The output control circuit 50, when the delay output signal from the delay circuit 40 is Low, performs through-output of a functional circuit part output signal from the functional circuit part 30, and when the delay output signal is High, holds and outputs a functional circuit part output signal from the functional circuit part 30, immediately before the delay output signal becomes High. As a result, during a time-period in which the delay output signal is High, even if a logic state of the functional circuit part 30 is inverted (in an example shown in FIG. 3, during a time-period T2 in which the delay output signal is High, a functional circuit part output signal is inverted from High to Low), a value of the functional circuit part output signal latched immediately before inverting is held and outputted as a post-control output signal to a later stage circuit 2.

Next, when a timer output signal and a MODE control output signal goes Low, in response to the MODE control output signal transitioning to Low, a state of the functional circuit part 30 also returns from an inverted state to a normal state, and the functional circuit part output signal returns from Low to the original High. At this time, the output control circuit 50 is released from a latched state, and the functional circuit part output signal from the functional circuit part 30 is passed through the output control circuit 50 and transferred to the later stage circuit (functional circuit) as a post-control output signal, as it is.

According to the operations described above, in the functional circuit 1, the logic state of the functional circuit part 30 is inverted at every prescribed time interval T0. With regard to NBTI, MISFETs in the functional circuit part 30 are alternately subjected to a stress state where the deterioration progresses and a stress state where the deterioration does not progress and hence NBTI recovery takes place. At this time, the output from the functional circuit 1 is able to maintain a previous state without change.

Figure 4:
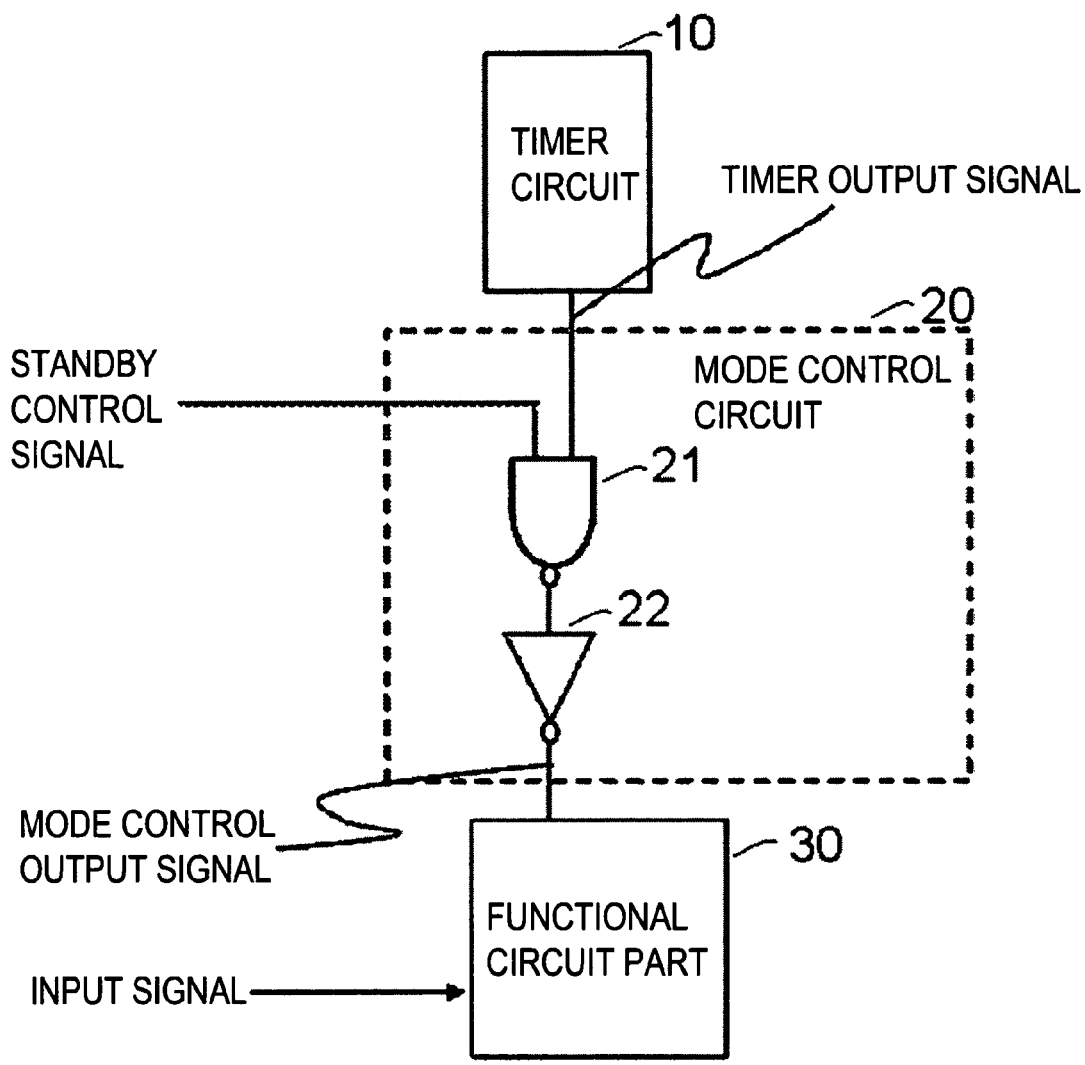
FIG. 4 is a diagram showing a configuration of a MODE control circuit of FIG. 2.
Figure 5:
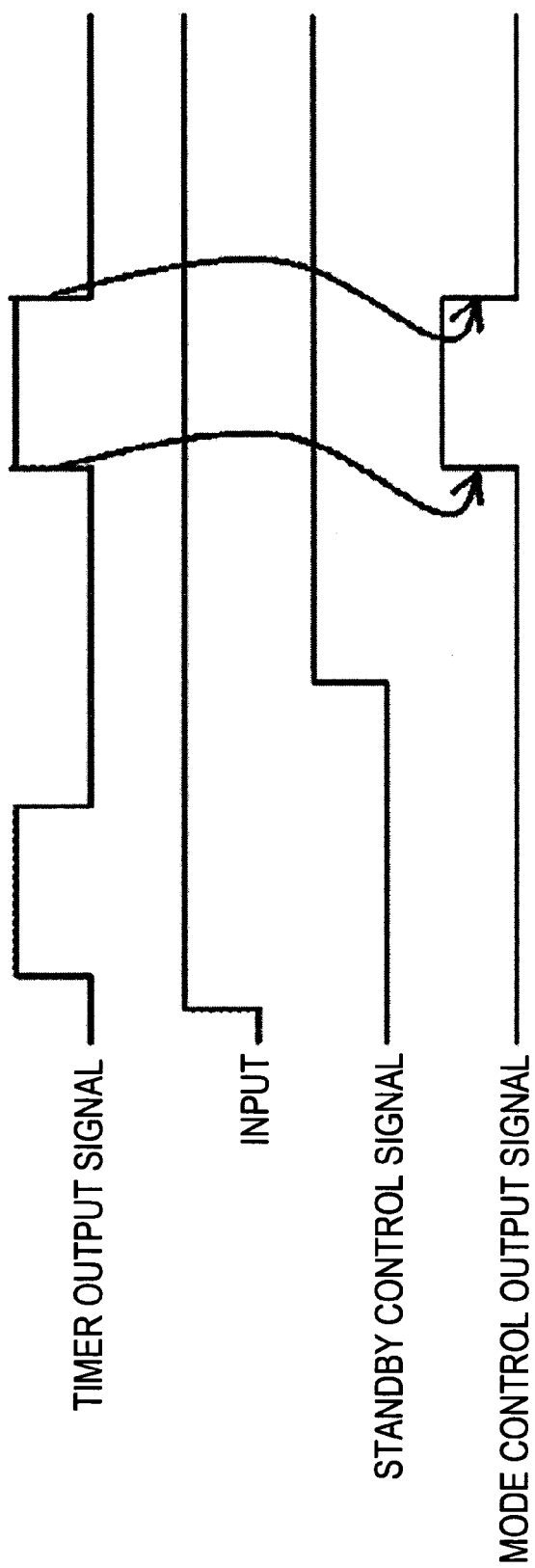
FIG. 5 is a timing chart describing circuit operation of the MODE control circuit of FIG. 4.

FIG. 4 is a diagram showing a configuration of the MODE control circuit 20. Referring to FIG. 4, the MODE control circuit 20 includes a NAND circuit 21 that receives a standby control signal and a timer output signal from the timer circuit 10, and an inverter 22 that inverts an output of the NAND circuit 21 and outputs the inverted signal as a MODE control output signal. FIG. 5 is a timing chart showing operation of the MODE control circuit 20 of FIG. 4. When both the timer output signal and the standby control signal are High, the MODE control output signal is High. It is to be noted that a delay from a rising edge of the timer output signal to a rising edge to the MODE control output signal, and a delay from a falling edge of the timer output signal to a falling edge to the MODE control output signal correspond to a sum of respective propagation delay times of the NAND 21 and the inverter 22.

Figure 6:
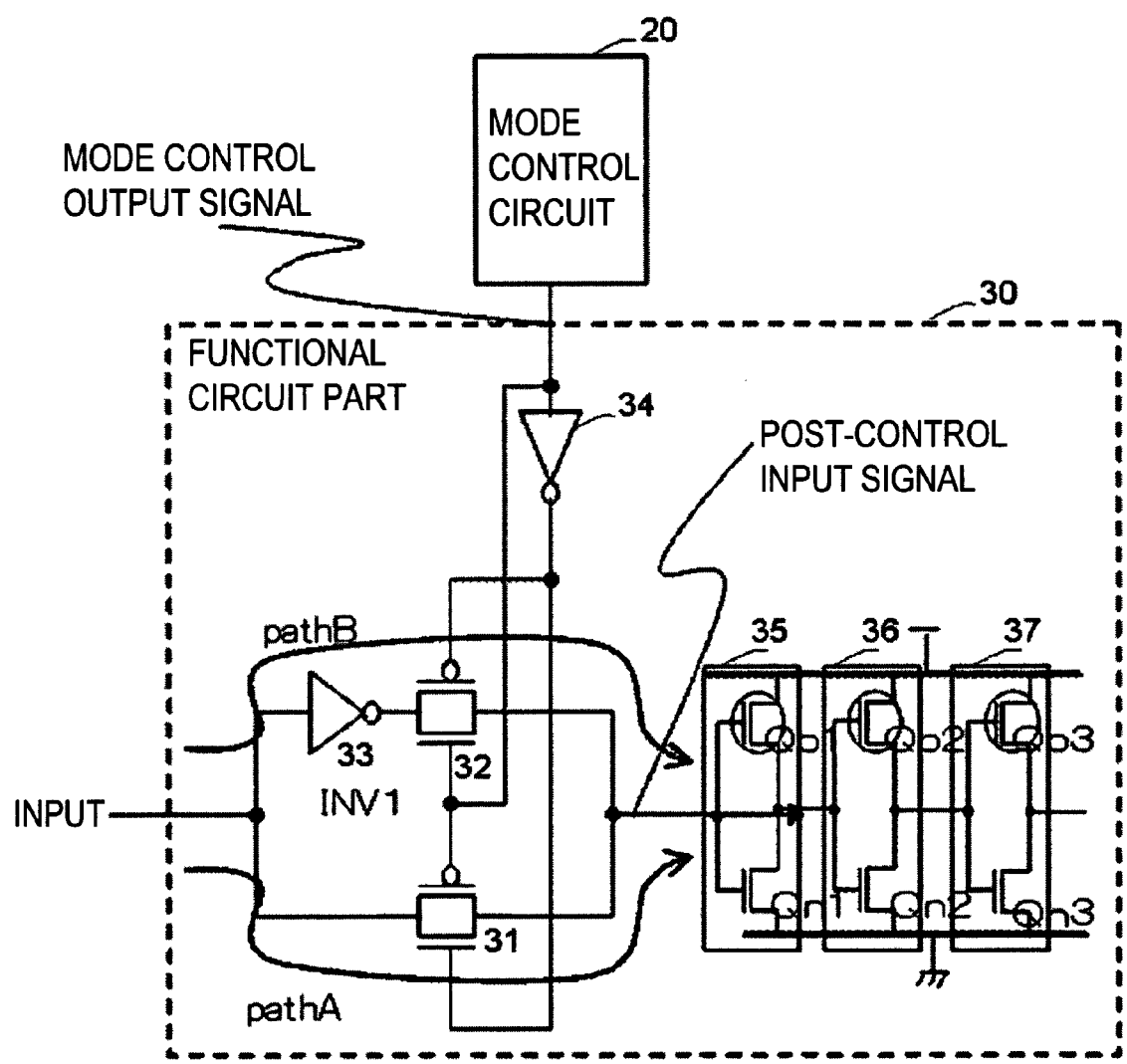
FIG. 6 is a diagram showing a configuration of a functional circuit part of FIG. 2.

FIG. 6 is a diagram showing a configuration example of a functional circuit part 30 of FIG. 2. Referring to FIG. 6, the functional circuit part 30 includes first and second transfer gates 31 and 32 formed of a P-type MISFET and an N-type MISFET, inverters 33 and 34, and three stage inverters 35, 36, and 37 formed of CMISFETs (Complementary MISFET). The circuit performing a function in the functional circuit part 30 is exemplified as three stage inverters (corresponding to a circuit described with reference to FIG. 1) only for the sake of simplification of the description, and as a matter of course, the present invention is not limited to this configuration. The transfer gates 31 and 32, and the inverters 33 and 34 form a change-over circuit that performs control of transferring to the three stage inverters in a state where the input to the functional circuit part 30 is inverted or in a state where the input is not inverted.

The inverter 34 generates an inverted signal of the MODE control output signal. The MODE control output signal is supplied to a gate of the P-type MISFET of the transfer gate 31 and a gate of the N-type MISFET of the transfer gate 32. The inverted version of the MODE control output signal is supplied to a gate of the N-type MISFET of the transfer gate 31 and a gate of the P-type MISFET of the transfer gate 32. An input signal is supplied to the transfer gate 31, and an inverted signal obtained by inverting the input signal by the inverter 33, is supplied to the transfer gate 32. Outputs of the transfer gates 31 and 32 are commonly connected to an input of an inverter 35 as a post-control input signal.

In the functional circuit part 30, when the input is not inverted, as in a normal operation, the MODE control output signal is set to Low, the transfer gate 31 is ON (conductive), the transfer gate 32 is OFF (non-conductive), and the input is transferred on a path A. When the input is inverted, the MODE control output signal is High, the transfer gate 32 is ON (conductive), the transfer gate 31 is OFF (non-conductive), and the input is transferred on a path B.

Figure 7:
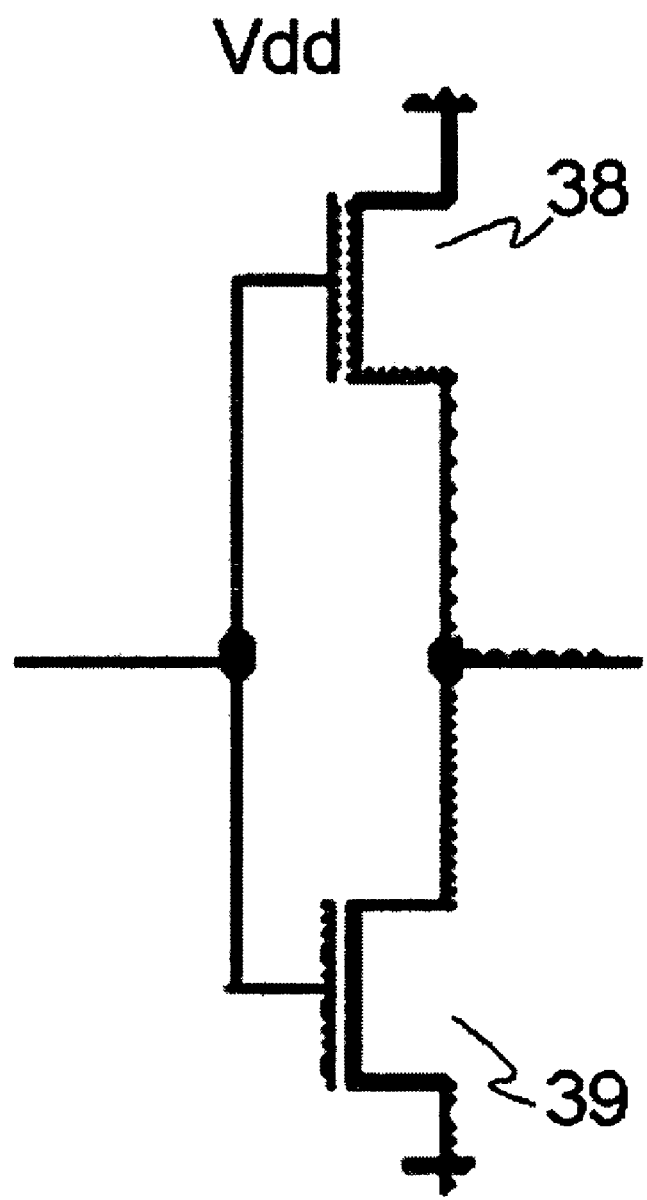
FIG. 7 is a diagram showing a configuration example of an inverter 33 of FIG. 6.

As long as the input to the inverter 33, which receives the input, does not change, the state is constant, so that if a P-type MISFET is used, a state where NBTI is progressing may occur. If P-type MISFET deterioration becomes a problem, the inverter may be composed by a depression N-type MISFET 38 and an enhancement N-type MISFET 39, as shown in FIG. 7. Alternatively, a P-type MISFET with a gate insulation film that is thick may be used.

Figure 8:
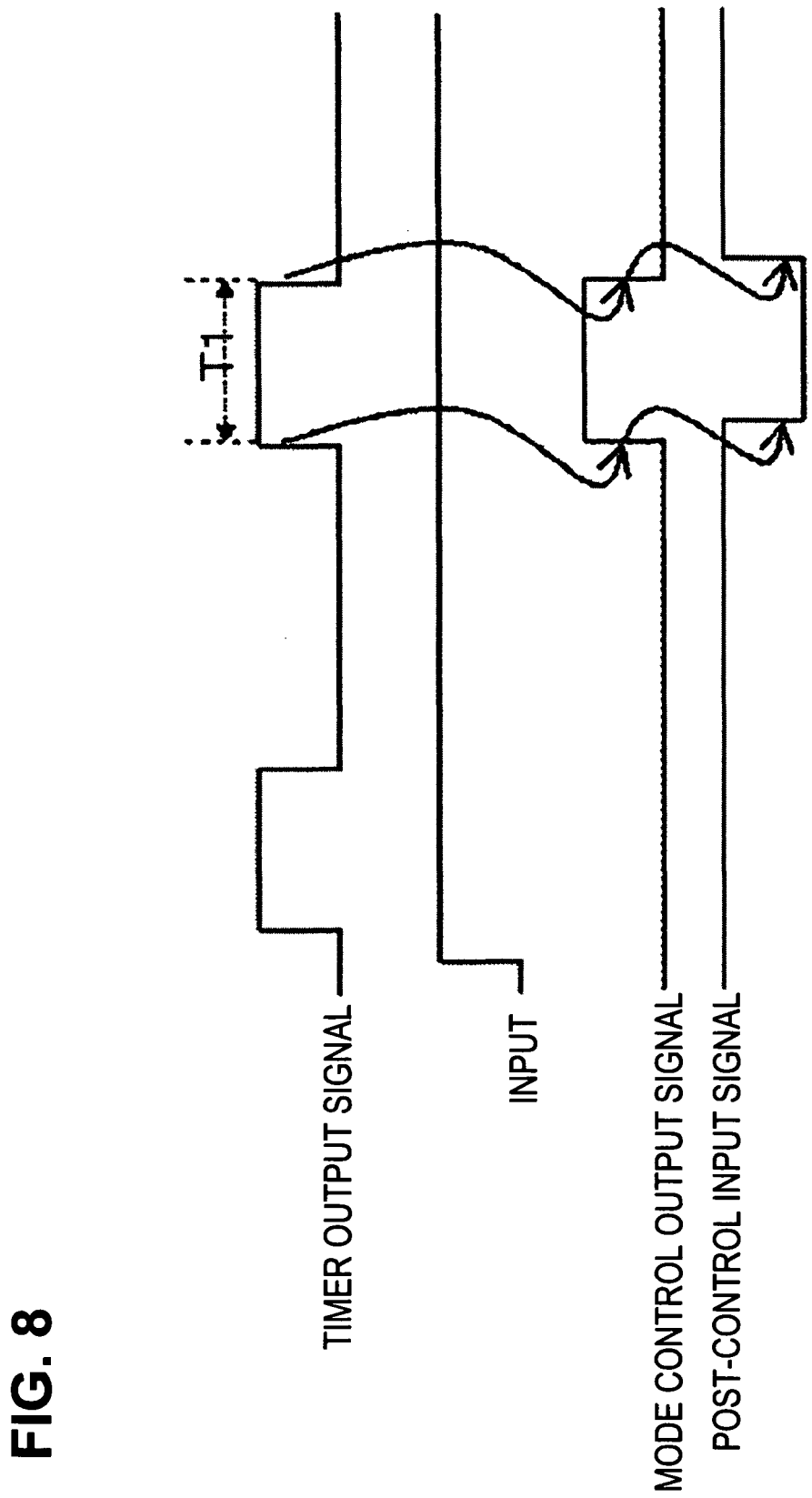
FIG. 8 is a timing chart describing circuit operation of the functional circuit part of FIG. 6.

FIG. 8 is a timing chart showing operation of the circuit of FIG. 6. When the MODE control output signal goes from Low to High, a post-control input signal is inverted. When the MODE control output signal is Low, the input is High, the post-control input signal has a High potential the same as the input, an N-type MISFET Qn1, a P-type MISFET Qp2, and an N-type MISFET Qn3 are ON, sources and drains of the N-type MISFETs Qn1 and Qn3 are at GND potential and gates are biased to a power supply potential Vdd, a source and drain of the P-type MISFET Qp2 are at the power supply potential Vdd, and a gate is biased to the GND potential. When the MODE control output signal goes to High, the post-control input signal, which is obtained by inverting the input by the inverter 33, goes to Low. The P-type MISFET Qp1, the N-type MISFET Qn2, and the P-type MISFET Qp3 are ON, sources and drains of the P-type MISFETs Qp1 and Qp3 are at the power supply potential Vdd, gates of the P-type MISFETs Qp1 and Qp3 are biased to the GND potential, a source and drain of the N-type MISFET Qn2 are at the GND potential, and the gate of the N-type MISFET Qn2 is biased to the power supply potential Vdd. When the MODE control output signal goes from High to Low, the post-control input signal returns to a value (original value) at a time when the MODE control output signal is Low.

Figure 9:
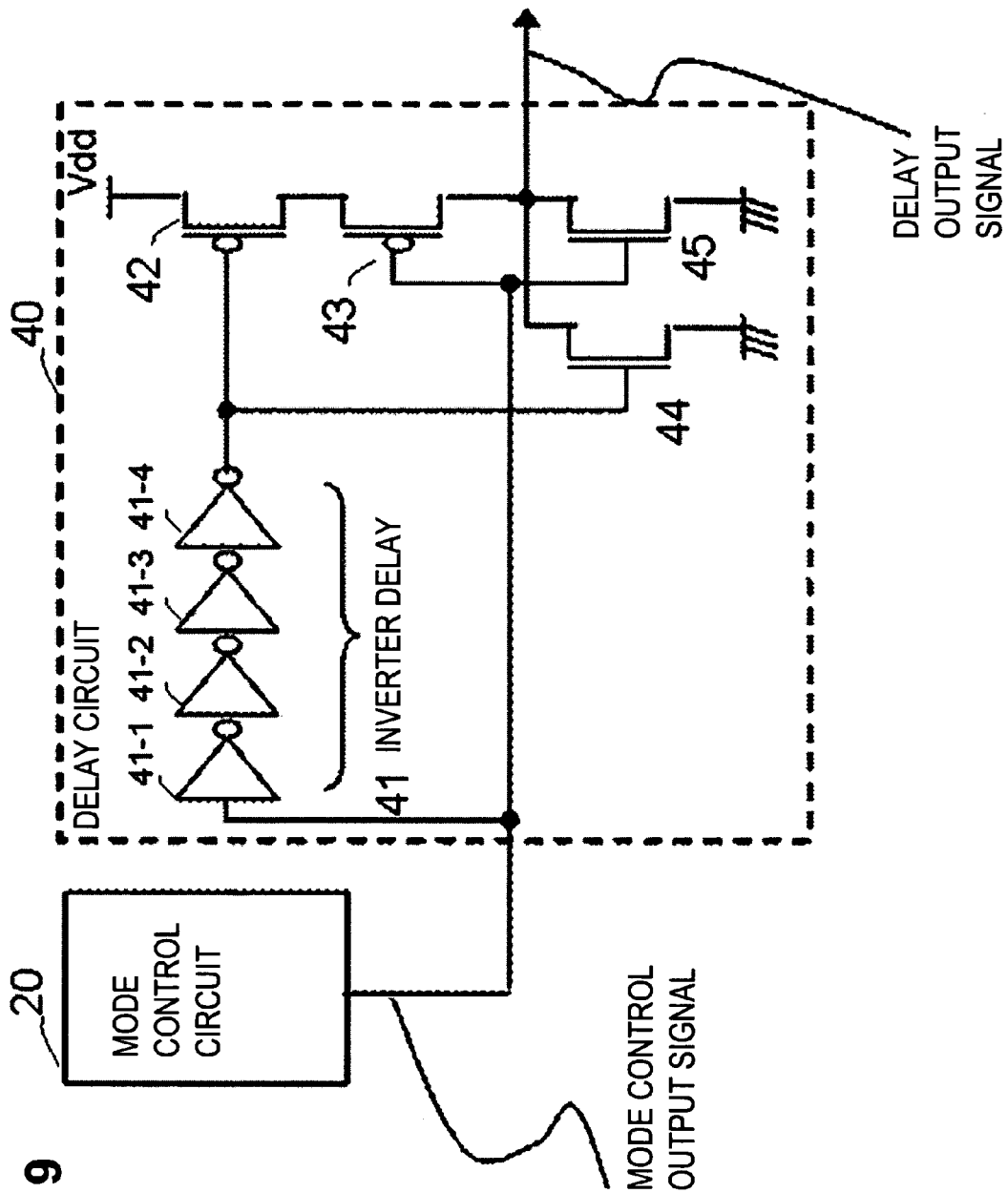
FIG. 9 is a diagram showing a configuration of a DELAY circuit of FIG. 2.

FIG. 9 is a diagram showing a circuit configuration of the DELAY circuit 40 of FIG. 2. Referring to FIG. 9, the delay circuit 40 includes an inverter delay circuit 41 that delays the MODE control output signal, a P-type MISFET 42 having a source connected to a power supply and having a gate supplied with an output of the inverter delay circuit 41, a P-type MISFET 43 having a source connected to a drain of the P-type MISFET 42 and having a gate supplied with the MODE control output signal, an N-type MISFET 44 having a source connected to GND and having a gate supplied with an output of the inverter delay circuit 41, and an N-type MISFET 45 having a source connected to GND and having a gate supplied with the MODE control output signal. Drains of the N-type MISFETs 44 and 45 and a drain of the P-type MISFET 43 are coupled together. A delay output signal is outputted from a node where the drains of the N-type MISFETs 44 and 45 and the P-type MISFET 43 are commonly connected.

When the MODE control output signal switches from Low to High, the delay output signal, with the N-type MISFET 45 being ON, promptly switches to Low. Conversely, in a case where the MODE control output signal goes from High to Low, the P-type MISFET 42 turns ON via the inverter delay circuit 41, so that raising the delay output signal to High is delayed. From this, when a functional circuit part inverts its logic state, a latch can be applied before output of the functional circuit part switches.

Conversely, when the latch is released, after the functional circuit part has returned to an original state, sufficiently, an output signal of the functional circuit part is transferred to a later stage. Therefore, it is possible to suppress unnecessary jitter in an output waveform.

Figure 10:
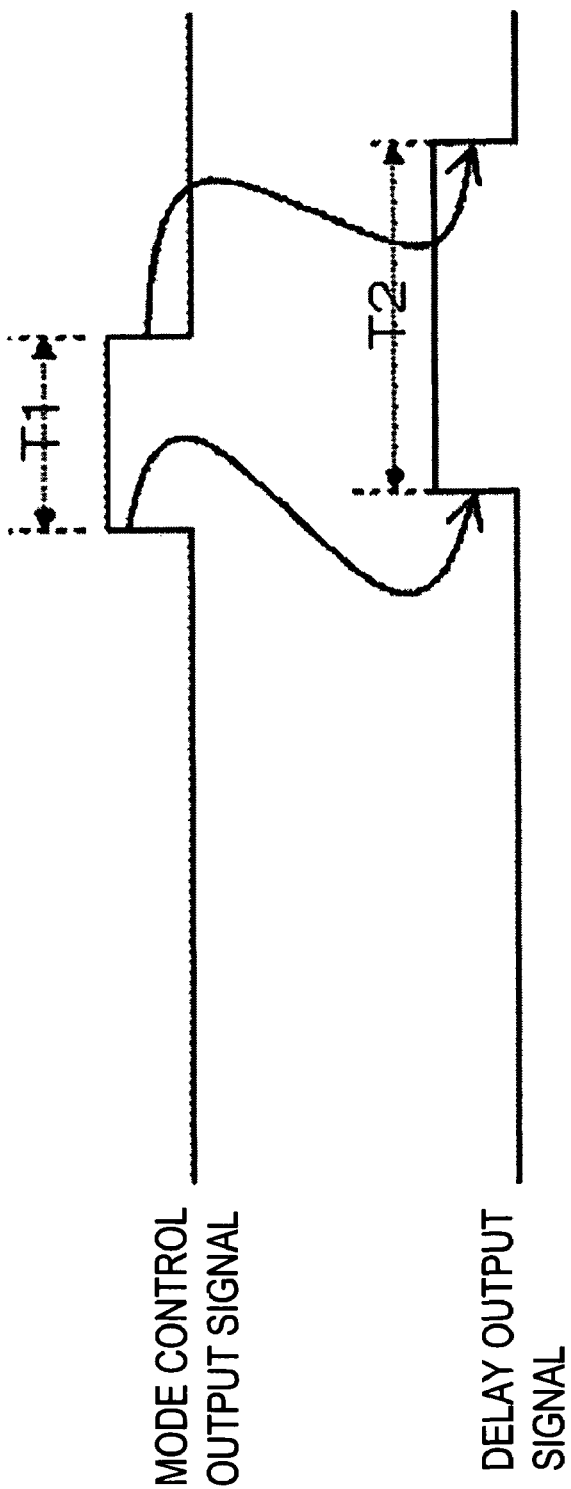
FIG. 10 is a timing chart describing circuit operation of the DELAY circuit of FIG. 9.

FIG. 10 is a timing chart showing the operation of the delay circuit of FIG. 9. As compared with a width T1 of a High time-period of the MODE control output signal, the width of a High time-period of the delay output signal T2 is extended by an inverter delay amount.

Figure 11:
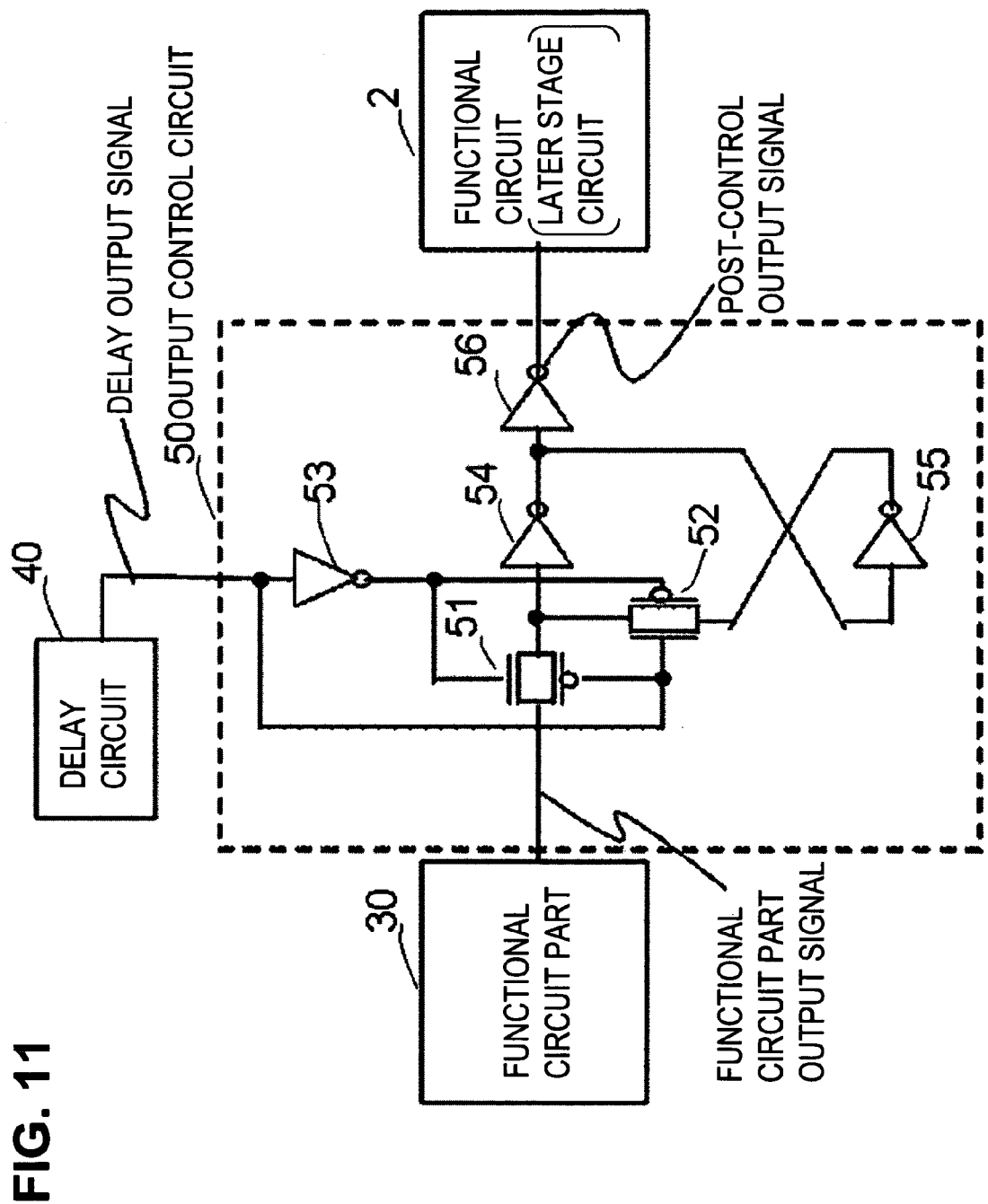
FIG. 11 is a diagram showing a configuration of an output control circuit of FIG. 2.

FIG. 11 is a diagram showing a configuration of the output control circuit 50. The output control circuit 50 outputs an input signal as it is, when the delay output signal is Low, and forms a latch circuit that latches and outputs a signal immediately before, when the delay output signal is High. The output control circuit 50 includes transfer gates 51 and 52, and inverters 53, 54, 55, and 56. When the delay output signal is Low, the transfer gate 51 is ON (conductive) and the transfer gate 52 is OFF (non-conductive), and through-output of a functional circuit part output signal to a functional circuit 2 of a later stage, as a post-control output signal, is made via the transfer gate 51, the inverter 54, and the inverter 56 (inverting type of an output buffer). When the delay output signal is High, the transfer gate 51 is OFF, the transfer gate 52 is ON, an output of the inverter 54 is connected to an input of the inverter 55, and an output of the inverter 55 is connected to an input of the inverter 54 to from a flip-flop (storage element). The functional circuit part output signal is outputted to the functional circuit 2 arranged at a later stage, as a post-control output signal, via the transfer gate 51 and the inverters 54 and 56.

Figure 12:
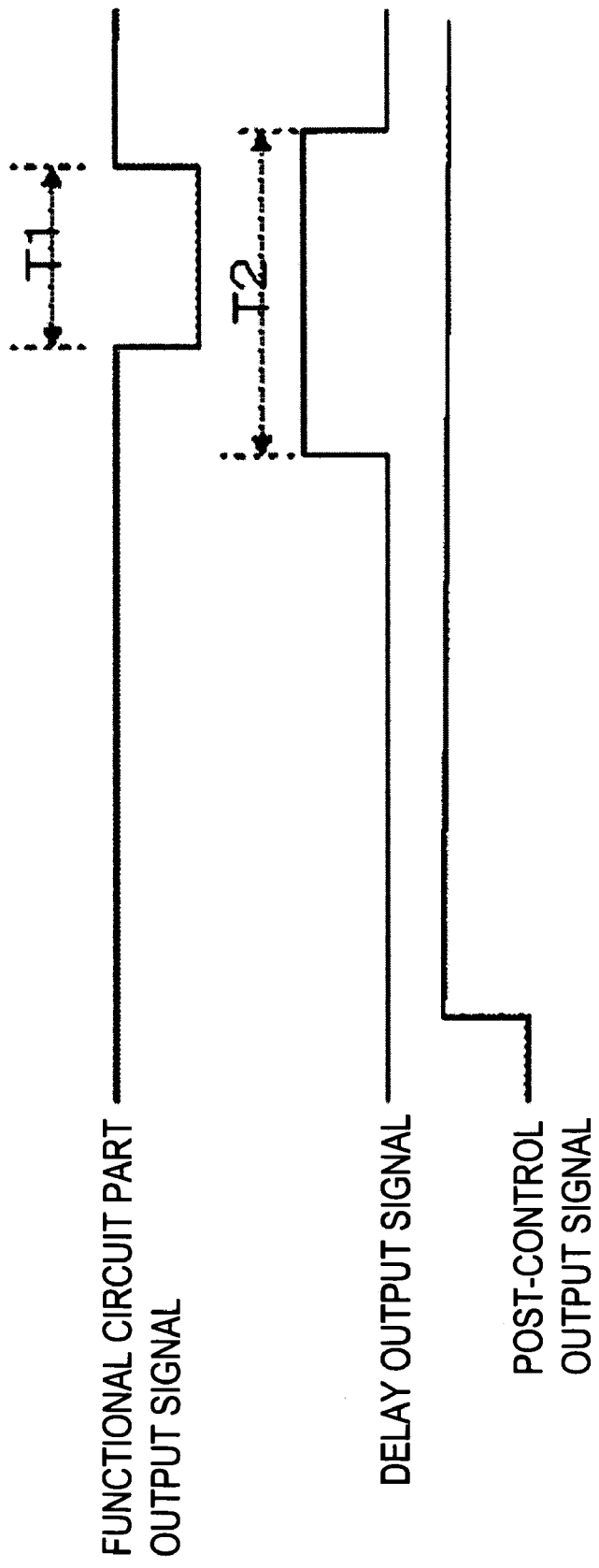
FIG. 12 is a timing chart describing circuit operation of an output control circuit of FIG. 11.

FIG. 12 is a timing chart showing operation of the output control circuit 50 of FIG. 11. As shown in FIG. 12, even if the state of the functional circuit part 30 is inverted, by control of the timer circuit 10, the post-control output signal continues to keep a previous state (a state immediately before the delay output signal becomes High), by control of the delay output signal.

Since a bias state and a logic state of a MISFET forming a functional circuit alternately change, a state where NBTI deterioration progresses or a state where PBTI deterioration progresses do not occur in a specified MISFET. Furthermore, with regard to NBTI, since recovery from deterioration progresses, the deterioration of the entire functional circuit is suppressed.

Second Exemplary Embodiment

Figure 13:
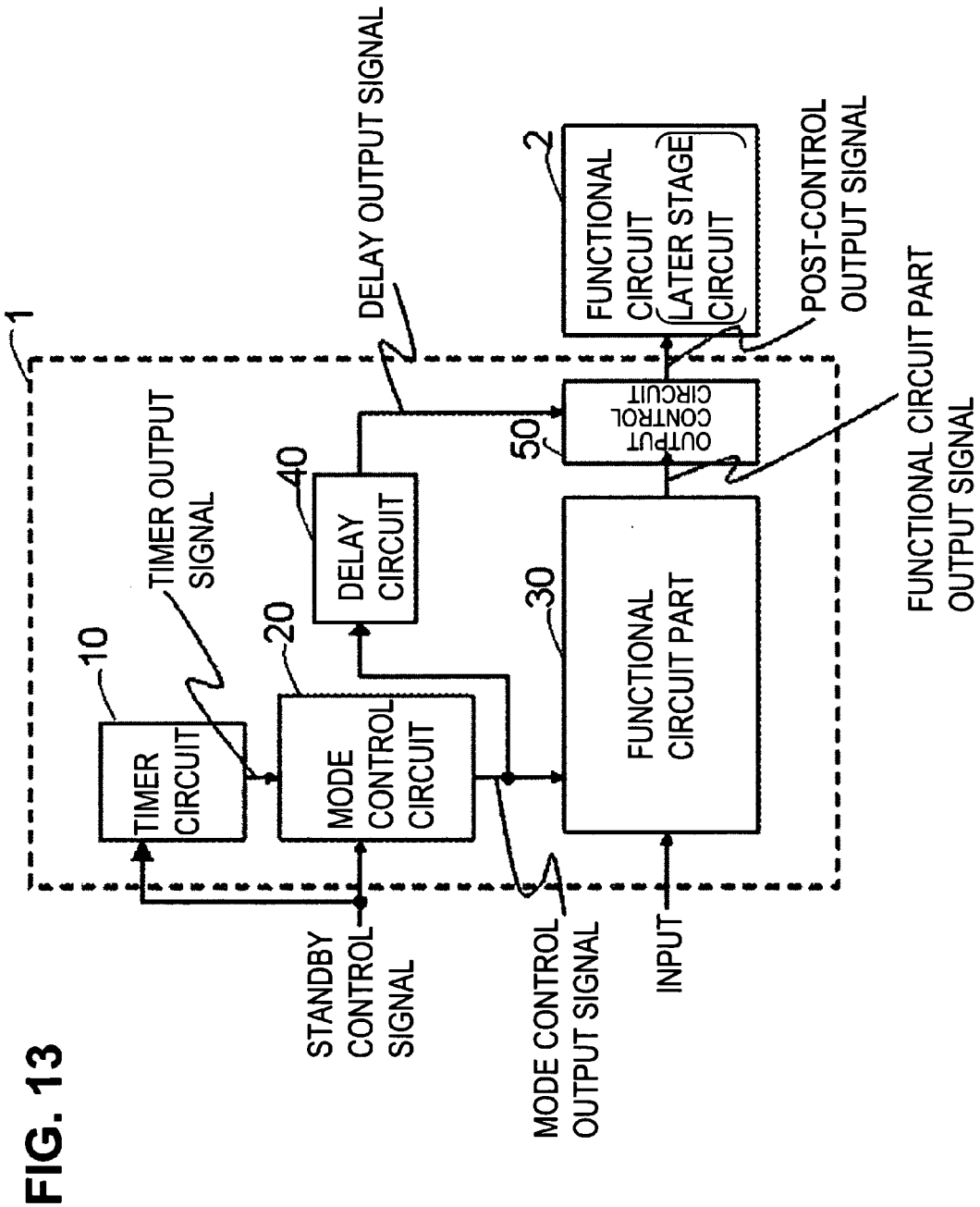
FIG. 13 is a diagram showing a configuration of a second exemplary embodiment of the present invention.

A second exemplary embodiment of the present invention will now be described. FIG. 13 is a diagram showing a configuration of a second exemplary embodiment of the present invention. In the second exemplary embodiment of the present invention, in contrast to the first exemplary embodiment, a timer circuit 10 is controlled by a standby control signal. In this way, the timer circuit 10 has a trigger applied and is activated only in a standby state. That is, the timer circuit 10 only operates at a time of a standby state, and a timer output signal is outputted.

Figure 14:
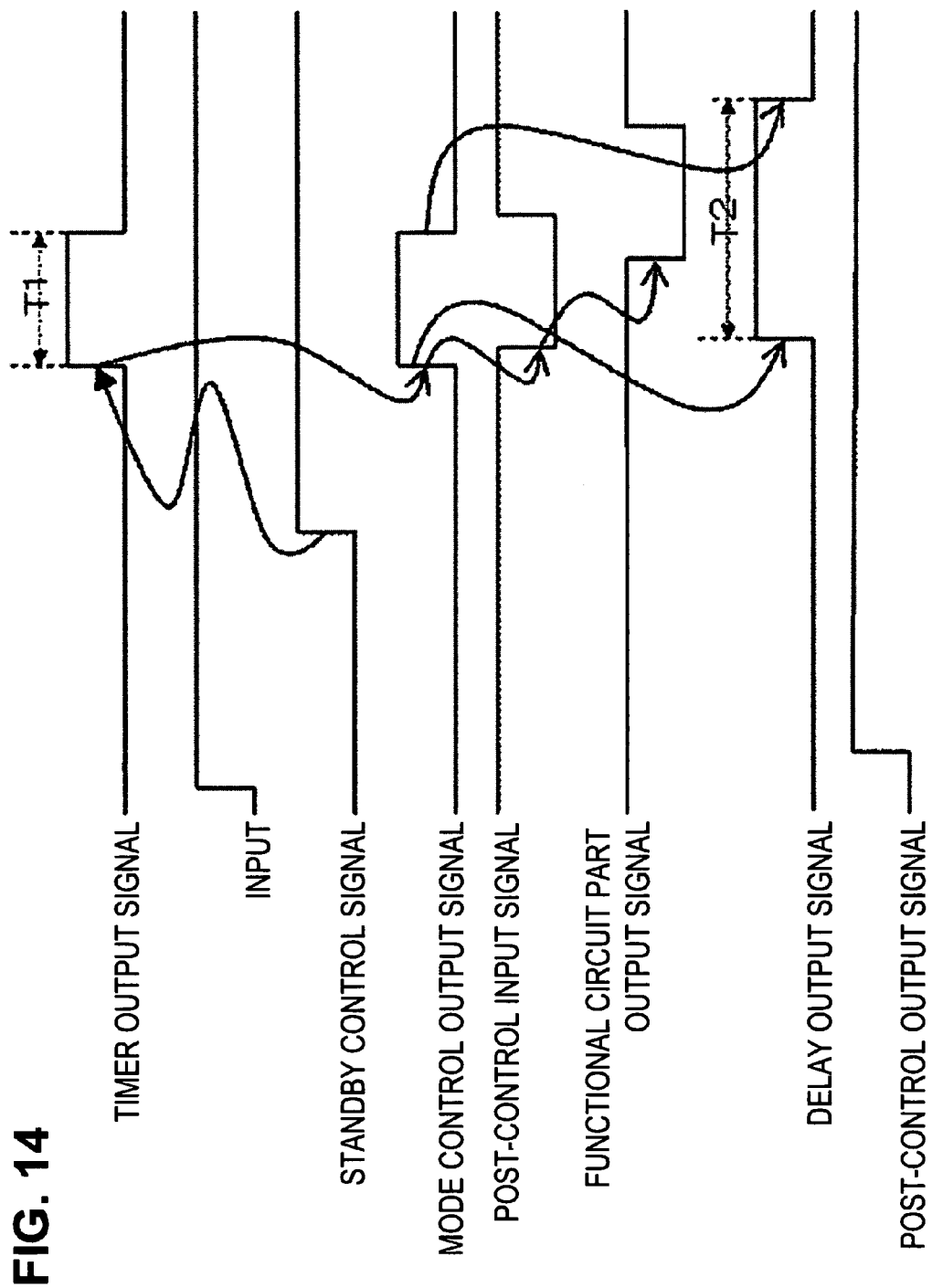
FIG. 14 is a timing chart describing operation of the second exemplary embodiment of the present invention.

FIG. 14 is a timing chart describing operation of the second exemplary embodiment of the present invention. As shown in FIG. 14, with a standby control signal as a trigger, the timer circuit 10 is activated, and a timer output signal is outputted. Frequency of the standby state (or time-period of the standby state) differs according to a product. As a result, according to the product, when the timer circuit 10 is constantly operated, there is a case where power consumption thereof is not negligible. Therefore, in the present exemplary embodiment, the timer circuit 10 is adapted to operate only at a standby time, based on a standby control signal. As a result, it is possible to reduce the power consumption.

Third Exemplary Embodiment

Figure 15:
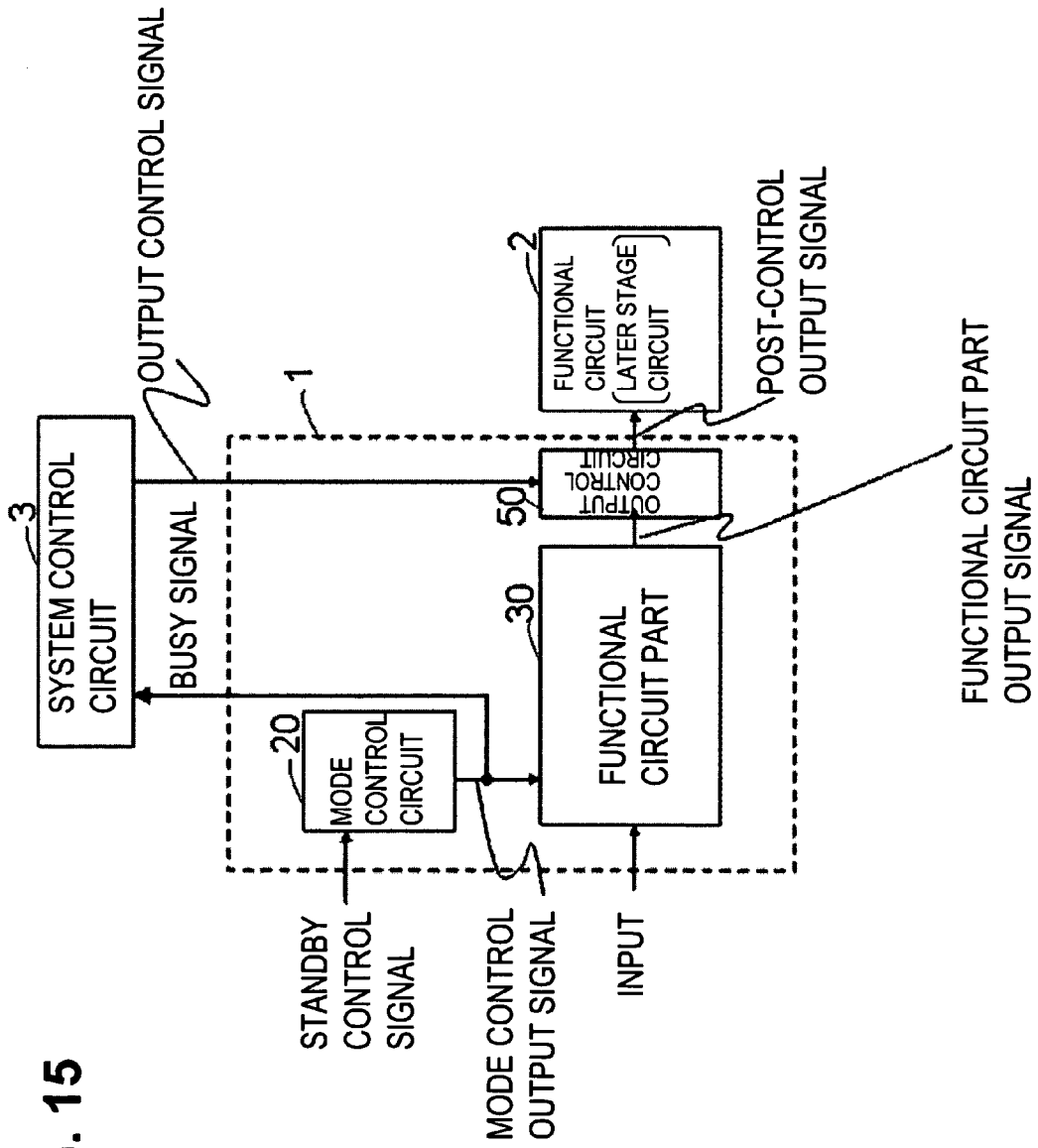
FIG. 15 is a diagram showing a configuration of a third exemplary embodiment of the present invention.

A third exemplary embodiment of the present invention will now be described. FIG. 15 is a diagram showing a configuration of the third exemplary embodiment of the invention. Referring to FIG. 15, in the present exemplary embodiment, from a MODE control output signal shown in the first exemplary embodiment, a Busy signal indicating the inverted state of a functional circuit part 30 in question, is outputted, and is transferred to a system control circuit 3 which controls an entire semiconductor device chip which includes circuits in FIG. 15.

In a time-period during when a state of the functional circuit part 30 is inverted, control is performed so that output (functional circuit part output signal) of the functional circuit part 30 is ignored. In the present exemplary embodiment, the system control circuit 3 that receives the Busy signal supplies an output control signal to an output control circuit 50, so that output of the functional circuit part 30 is ignored. With regard to the output control circuit 50, based on an output control signal from the system control circuit 3, in a time-period in which a state of the functional circuit part 30 is inverted, the functional circuit part output signal, which was outputted from the functional circuit part 30, is not outputted, and the functional circuit part output signal immediately before the state in the functional circuit part 30 was inverted is held and outputted.

FIG. 16 is a timing chart describing operation of FIG. 15. As shown in FIG. 16, during a standby state (a time-period in which the standby control signal is High) a busy signal of High (a MODE control output signal from a MODE control circuit 20) is transferred to the system control circuit 3. The system control circuit 3 outputs an output control signal, controls the output control circuit 50, and performs control so that output of the functional circuit part 30 is not transferred to a functional circuit 2 of a later stage.

As shown in FIG. 16, when the output control signal is High, the functional circuit part output signal, which is Low, is not communicated to a post-control output signal, and the post-control output signal continues to be outputted at High level, which is the value immediately before the MODE control output signal changes to High.

In FIG. 15, output of the functional circuit 1 is controlled by the system control circuit 3, but the system control circuit 3 may control a plurality of functional circuits. For example, when control is performed so as to stop all output from a chip to the outside, it is possible to suppress MISFET deterioration in a circuit in a wide area.

It is to be noted that that the various disclosures of the abovementioned Patent Documents are incorporated herein by reference thereto. Modifications and adjustments of embodiments and examples are possible within the bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention clearly includes every type of transformation and modification that a person skilled in the art can realize according to the entire disclosure including the scope of the claims and to technological concepts thereof.

What is claimed is:

1. A semiconductor integrated circuit device comprising
a functional circuit part that includes a plurality of field effect transistors to perform a predetermined function;
a timer circuit that generates a timer output signal at every prescribed time interval;
a mode control circuit that receives a first control signal and that when said first control signal is in an active state, generates a second control signal that is used to change a logic state of said functional circuit part, at every prescribed time interval, responsive to said timer output signal outputted from said timer circuit;
an output control circuit that receives an output signal of said functional circuit part and controls output of said output signal; and
a control signal generation circuit that generates a third control signal responsive to said second control signal and supplies said third control signal to said output control circuit, wherein during a time period when said functional circuit part changes a logic state responsive to said second control signal, said output control circuit, responsive to said third control signal, performs control so as not to transfer an output signal of said functional circuit part to an output of said output control circuit, but to hold and output an output signal of said functional circuit part immediately before said functional circuit part changes a logic state thereof responsive to said second control signal.

2. The semiconductor integrated circuit device according to claim 1, wherein said first control signal is a signal used to control a standby state of a functional circuit including said functional circuit part, said timer circuit, said mode control circuit, said output control circuit and said control signal generation circuit.

3. The semiconductor integrated circuit device according to claim 1, wherein said control signal generation circuit comprises
    a delay circuit that delays said second control signal for a prescribed time and supplies a delayed version of said second control signal as said third control signal to said output control circuit.

4. The semiconductor integrated circuit device according to claim 1, wherein said field effect transistors include MISFETs (Metal-Insulator-Semiconductor Field Effect Transistor),
    based on said second control signal that changes a logic state of said functional circuit part at every prescribed time interval, said plurality of MISFETs included in said functional circuit part are alternately subjected to:
    a stress state where NBTI (Negative Bias Temperature Instability) or PBTI (Positive Bias Temperature Instability) progresses and
    a stress state where NBTI or PBTI does not progress.

5. The semiconductor integrated circuit device according to claim 1, wherein said timer circuit receives said first control signal, said timer circuit, when said first control signal is activated, generating said timer output signal at every prescribed time interval, and when said first control signal is not activated, stopping to generate said timer output signal.

6. The semiconductor integrated circuit device according to claim 4, wherein in said plurality of MISFETs forming said functional circuit part, time of a stress state where NBTI or PBTI progresses and time of a stress state where NBTI or PBTI does not progress are substantially equal.

7. The semiconductor integrated circuit device according to claim 1, wherein said field effect transistors of said functional circuit part include
    a plurality of stages of MISFET (Metal-Insulator-Semiconductor Field Effect Transistor) pairs arranged in a cascade connection, each of said MISFET pairs including a first conductive type and a second conductive type MISFETs connected in series between a first power supply and a second power supply,
    based on an input signal supplied to said functional circuit part, when one of said MISFETs of said MISFET pair being controlled to be turned ON, the other of said MISFET pair being controlled to be turned OFF.

8. The semiconductor integrated circuit device according to claim 7, wherein said functional circuit part comprises
    a circuit that generates an inverted version of said input signal and supplies said inverted version of said input signal to a first stage of said plurality of stages of said MISFET pairs when said second control signal assumes a first logic value, and supplies said input signal to said first stage of said plurality of stages of said MISFET pairs when said second control signal assumes a second logic value.

9. The semiconductor integrated circuit device according to claim 8, wherein said output control circuit comprises
    a latch circuit that receives said output signal of said functional circuit part and said third control signal, wherein
    when said third control signal assumes said second logic value, said output signal of said functional circuit part is passed through said latch circuit and transferred to said output of said output control circuit, and
    when said third control signal assumes said first logic value, said output signal of said functional circuit part is not passed through said latch circuit and said latch circuit holds and outputs said output signal of said functional circuit part latched immediately before said third control signal assumes said first logic value.

10. The semiconductor integrated circuit device according to claim 1, comprising
    a system control circuit serving as said control signal generation circuit, wherein said functional circuit part is configured to output a busy signal when said functional circuit part changes a logic state thereof, responsive to said timer output signal,
    said system control circuit, responsive to said busy signal outputted from said functional circuit part, generating said third control signal for supply to said output control circuit,
    said output control circuit, during a time period when said functional circuit part changes a logic state thereof, performing control, responsive to said third control signal, so as not to transfer an output signal of said functional circuit part to an output of said output control circuit, but to hold and output an output signal of said functional circuit part immediately before said functional circuit part changes a logic state thereof responsive to said second control signal.

\* \* \* \* \*